United States Patent
Reiss et al.

(10) Patent No.: US 12,105,155 B2
(45) Date of Patent: Oct. 1, 2024

(54) METHOD FOR TESTING A CELL MONITORING UNIT, AND TESTING DEVICE

(71) Applicant: Bayerische Motoren Werke Aktiengesellschaft, Munich (DE)

(72) Inventors: Benjamin Reiss, Ladenburg (DE); Steffen Rothe, Dresden (DE); Axel Scheffler, Barbing (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 17/773,139

(22) PCT Filed: Oct. 30, 2020

(86) PCT No.: PCT/EP2020/080522
§ 371 (c)(1),
(2) Date: Apr. 29, 2022

(87) PCT Pub. No.: WO2021/084075
PCT Pub. Date: May 6, 2021

(65) Prior Publication Data
US 2024/0183914 A1   Jun. 6, 2024

(30) Foreign Application Priority Data

Oct. 31, 2019   (DE) ............... 10 2019 129 483.5

(51) Int. Cl.
*G01R 31/396*   (2019.01)
*G01R 31/3842*   (2019.01)
*G01R 35/00*   (2006.01)

(52) U.S. Cl.
CPC ....... *G01R 31/396* (2019.01); *G01R 31/3842* (2019.01); *G01R 35/00* (2013.01)

(58) Field of Classification Search
CPC .. G01R 31/396; G01R 31/3842; G01R 35/00; G01R 31/52; G01R 31/50; H01M 2010/4271
See application file for complete search history.

(56) References Cited

U.S. PATENT DOCUMENTS 5,467,024 A   11/1995 Swapp
6,313,657 B1   11/2001 Hashimoto
(Continued)

FOREIGN PATENT DOCUMENTS

CN   108445404 A   8/2018
DE   10 2016 224 492 A1   6/2018

OTHER PUBLICATIONS

L. Buccolini, S. Orcioni, S. Longhi and M. Conti, "Cell Battery Emulator for Hardware-in-the-Loop BMS Test," 2018 IEEE International Conference on Environment and Electrical Engineering and 2018 IEEE Industrial and Commercial Power Systems Europe (EEEIC / I&CPS Europe), Palermo, Italy, 2018, pp. 1-5 (Year: 2018).*

(Continued)

*Primary Examiner* — Daniel R Miller
(74) *Attorney, Agent, or Firm* — Crowell & Moring LLP

(57) ABSTRACT

A method is used to test a cell monitoring unit, in which method respective cell voltages are applied to cell voltage connections of the cell monitoring unit. A measurement is then carried out on a cell monitoring unit which is in operation in order to determine whether a respective current is flowing via at least one cell voltage connection, and a fault message is output if this is the case. A testing device is used to test a cell monitoring unit and has at least one current measuring apparatus for measuring currents at cell voltage connections of the cell monitoring unit. The testing device is configured to carry out the method. The method and testing (Continued)

device are applicable in particular to testing a cell monitoring unit of a vehicle, in particular of an electric vehicle.

8 Claims, 3 Drawing Sheets

(56) References Cited

U.S. PATENT DOCUMENTS

| | | |
|---|---|---|
| 7,590,902 B1 | 9/2009 | Tabatabaei et al. |
| 2008/0208490 A1* | 8/2008 | Matsumoto ....... H01M 8/04671 |
| | | 702/58 |
| 2015/0301120 A1 | 10/2015 | Tran et al. |
| 2016/0291114 A1* | 10/2016 | Bacquet ............. G01R 31/3644 |
| 2018/0217206 A1* | 8/2018 | Kiuchi .................. H02J 7/0025 |

OTHER PUBLICATIONS

International Search Report (PCT/ISA/210) issued in PCT Application No. PCT/EP2020/080522 dated Feb. 15, 2021 with English translation (five (5) pages).

German-language Written Opinion (PCT/ISA/237) issued in PCT Application No. PCT/EP2020/080522 dated Feb. 15, 2021 (six (6) pages).

German-language Search Report issued in German Application No. 10 2019 129 483.5 dated Oct. 31, 2020 with partial English translation (10 pages).

* cited by examiner

METHOD FOR TESTING A CELL MONITORING UNIT, AND TESTING DEVICE

BACKGROUND AND SUMMARY

The invention relates to a method for testing a cell monitoring unit, in which method respective cell voltages are applied to the cell voltage connections of the cell monitoring unit. The invention also relates to a testing device for testing a cell monitoring unit, which testing device is set up to carry out the method. The invention can particularly advantageously be applied to testing a cell monitoring unit of a vehicle, in particular an electric vehicle.

Batteries for electric vehicles today often comprise a battery module having a plurality of battery cells, for example lithium-ion cells, and a cell monitoring unit for monitoring a faulty state of the battery cells. If batteries are reported as faulty by a customer, in approximately half of cases it is typically not the battery cells that have a fault but the cell monitoring unit (which can also be referred to as CSC—cell supervisory circuit) that monitors the battery cells. In order to check whether the cell monitoring unit is faulty, the cell monitoring unit has until now been removed from the battery, sent to the manufacturer and tested there. Until now, the testing has involved carrying out the following steps: manually measuring all of the cell voltages of a known fault-free battery module, subsequently connecting the cell monitoring unit to the battery module, determining the individual cell discharge rates and, if an excessively high cell discharge rate is determined, determining the cell monitoring unit as faulty. In this case, use is made of the knowledge that cell discharge ought not be able to take place in a fault-free cell monitoring unit. If a voltage drop is thus determined across at least one battery cell, this is an indication of a fault in the cell monitoring unit. A disadvantage here is that, in order to reliably determine a possible voltage drop, the cell monitoring unit has to remain connected to the fault-free battery module over a long period (approximately 24 to 48 hours) and then the cell voltages applied to all of the battery cells have to be measured again and compared with the values before the cell monitoring unit was connected.

It is the object of the present invention to at least partly overcome the disadvantages of the prior art and in particular to provide a simple and rapid possibility of checking the susceptibility of a cell monitoring unit to faults.

This object is achieved in accordance with the features of the independent claims. Advantageous embodiments are the subject matter of the dependent claims, the description and the drawings.

The object is achieved by means of a method for testing a cell monitoring unit, in which method respective cell voltages are applied to cell voltage connections of the cell monitoring unit and a measurement is carried out on a cell monitoring unit which is in operation in order to determine whether a respective current is flowing via at least one cell voltage connection, and, if this is the case, a fault message is output.

This method results in the advantage that it is possible to make a statement about the state of the cell monitoring unit in a few minutes because it is now no longer a cell voltage difference that is checked to monitor a cell discharge but instead a current that flows via the cell voltage connections that is measured, the current corresponding to discharge currents of a real battery module. Use is made here of the fact that low currents can also be measured reliably and also permanently arise while a cell voltage is applied. Thus, an outlay for checking the cell monitoring unit can in turn be reduced. The outlay can therefore also be reduced because the cell voltages of a fault-free battery module no longer need to be measured. This in turn results in the further advantage that even staff who have not been trained to work on an open battery can perform the testing. In particular, the testing of the cell monitoring unit can now, where appropriate, be carried out even in the workshop, which makes it unnecessary to send the cell monitoring unit to the manufacturer and back to the workshop.

The cell monitoring unit typically comprises voltage connections (referred to in the text which follows as "cell voltage connections" without restricting generality), which are connected to respective battery cells during real operation of a vehicle and measure the cell voltage of the battery cells. The cell voltage is a DC voltage.

The fact that the method involves respective cell voltages being applied to the cell voltage connections in particular includes those cell voltages that correspond to the cell voltages of the battery cells of a real battery module being applied to the cell voltage connections. The operating cell monitoring unit to be checked operates as in real driving operation.

One development is that the cell voltages are applied to a known faulty battery module by connecting the cell monitoring unit. The battery module can be provided to supply power to an electric vehicle and can comprise battery cells in the form of lithium-ion cells, for example. However, manual measurement of the cell voltages can be omitted here.

One development is that the cell voltages are connected to respectively appropriately adjusted voltage sources of a voltage generator by connecting the cell voltage connections. In the latter case, the cell monitoring unit is advantageously deceived into seeing a connection to a real battery module.

In principle, it is possible to measure the discharge currents that flow at the cell voltage connections at the same time, for example by providing a corresponding number of current measuring apparatuses. This results in the advantage that the current measuring apparatuses are able to remain in an electrical line that potentially leads the DC discharge current.

One configuration is that the current at the cell voltage connections is measured successively. This achieves the advantage that only one current measuring apparatus is required, which saves costs and installation space. Even in this case, it is possible to finish checking the cell monitoring unit in a few minutes.

Particularly if the cell monitoring unit is set up to identify interruptions in a cell voltage and to trigger an action (for example to output a fault message, to decouple the associated battery cell, etc.) in response thereto, one configuration is that, in order to measure the current, a current measuring apparatus is interconnected without interruption in an electrical line ("current line") of a respective cell voltage connection, the line leading to a respective cell voltage connection and potentially conducting a (discharge) current in the event of a fault. This achieves the advantage that possible discharge currents can be measured rapidly and without interference. In this case, "without interruption" is to be understood as meaning that the current line to the cell monitoring unit is not interrupted in order to couple or interconnect the current measuring apparatus into the line or current path and also to remove it from the line again.

A particularly reliable configuration that can be implemented inexpensively is that, in order to interconnect the current measuring apparatus in the current line, the current measuring apparatus is initially connected in parallel with the current line and then the branch of the current line in parallel with the connections of the current measuring apparatus is opened.

One configuration is that a fault message is output when a respective current is measured at at least one cell voltage connection at all. In this case, it is assumed that the cell monitoring unit does not permit a discharge current in the fault-free state. That is to say if an electric current Imess>0 is measured at any of the cell voltage connections, a fault in the cell monitoring unit can be assumed.

One configuration is that a fault message is output when a respective current that is equal to or greater than a predetermined threshold value is measured at at least one cell voltage connection, that is to say whether Imess≥Ith applies for at least one cell voltage connection. This achieves the advantage that tolerances are taken into account in the current measurement and no false fault message about a faulty state of the cell monitoring unit is output. The threshold value Ith may be between 2 and 10 mA, for example.

One configuration is that the cell voltages applied to the cell voltage connections are additionally measured. It is thus also advantageously possible to check whether the cell voltage measured by the cell monitoring unit deviates from the applied cell voltage. Such a deviation can likewise indicate a faulty cell monitoring unit and likewise trigger a fault message, where required. One development is that the cell voltages can also be measured sequentially, in particular immediately before or after a current measurement for the same cell voltage connection.

The object is also achieved by a testing device for testing a cell monitoring unit, comprising at least one current measuring apparatus for measuring currents at cell voltage connections of the cell monitoring unit, wherein the testing device is set up to carry out the method as described above. The testing device can be designed analogously to the method and has the same advantages.

One configuration is that the testing device comprises a, in particular exactly one, current measuring apparatus, a control device and for each cell voltage connection to be monitored a first switch, the first connection of which is connected to the current line and the second connection of which is connected to a first connection of the current measuring apparatus, a second switch in the form of a toggle switch, the central connection and first contact connection of which are connected to the current line, the first contact connection of which is connected to the first connection of the first switch and the second contact connection of which is connected to a second connection of the current measuring apparatus, and a third switch, which is interconnected, in the current line, between the central connection and the first contact connection of the second switch, wherein the control device is configured in a rest state outside of a current measuring procedure to switch the switches in such a way that:

the first switch is switched off,
the central connection of the second switch is connected to the first contact connection of the second switch, and
the third switch between the central connection and the first contact connection of the second switch is switched on, and the control device for a current measuring procedure is configured:

initially to switch off the first switch and to connect the central connection of the second switch to the second contact connection of the second switch, and
then to switch off the third switch between the central connection and the first contact connection of the second switch.

This configuration has the advantage that the current measuring apparatus can be interconnected in the current line reliably without interruption of the current line. In addition, the design can be implemented in an inexpensive and robust manner.

One advantageous development is that the switches are relays because they are particularly robust and also bring about DC isolation in the off or open state. However, the switches can also in principle be electronic switches such as power semiconductors, for example triacs.

In the above embodiment, an off switch does not permit a flow of current through it. An off switch can also be referred to as an open switch. In contrast, in the on state, the switch permits a flow of current through it. An on switch can also be referred to as a closed switch.

In particular, the first switch and the third switch can be designed as on/off switches. In one development, on/off switches can be present in the form of toggle switches, in which a contact connection is a free connection.

In the above embodiment, in particular a first connection of the third switch is connected to the first connection of the first switch and a second connection of the third switch is connected to the central connection of the second switch. The second switch and the third switch can also be considered as switches present in parallel branches of the current line.

One configuration is that the third switch is a toggle switch, which is connected by way of the central connection thereof to the first connection of the first switch, is connected by way of the first contact connection thereof to the central connection of the second switch and is connected by way of the second contact connection thereof to a voltage tap. This achieves the advantage that, when the positive line of an i-th cell voltage connection corresponds to a negative line of an (i+1)-th cell voltage connection, the third switch can assume a double function as a switch for measuring the current of the i-th cell voltage connection and as a switch for measuring the voltage of the (i+1)-th cell voltage connection. As a result, separate switches for performing these functions can be dispensed with, which makes a particularly inexpensive and compact design possible.

One development is that a plurality of cell voltage connections are interconnected in such a way that a positive line of a cell voltage connection corresponds to a negative line of the following cell voltage connection in the manner of a chain.

The above-described properties, features and advantages of this invention and the way in which they are achieved will become clearer and more clearly understood in association with the following schematic description of an exemplary embodiment which is explained in greater detail in association with the drawings.

DETAILED DESCRIPTION OF THE DRAWINGS

Figure 1:
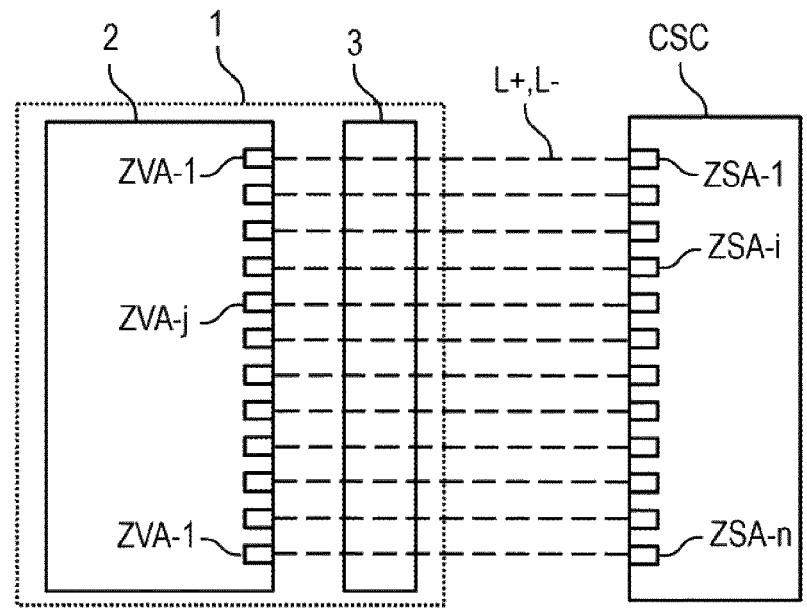
FIG. 1 is a sketch of components of a testing device for testing a cell monitoring unit.

FIG. 1 shows a sketch of components of a testing device 1 for testing a cell monitoring unit CSC. The cell monitoring unit CSC comprises i=1, . . . , n cell voltage connections ZSA-i, wherein n may be for example 12, 16, 20 or more. The testing device 1 comprises a voltage source unit 2, for example a voltage generator or a fault-free battery module, the j=1, . . . , m, with m≥n, cell voltage supply connections ZVA-j of which are connected to a respective cell voltage connection ZSA-i via a respective pair of a "positive" electrical line L+ at a first voltage level and a "negative" electrical line L− at a lower voltage level with respect thereto. The voltage difference applied to the lines L+, L− of a cell voltage connection ZSA-i corresponds to the respective cell voltage Uz-i. The cell voltages Uz-i may be different or the same.

In one development, the cell voltage supply connections ZVA-j and cell voltage connections ZSA-i can be electrically connected or chained in series in the sense that the positive line L+ of a cell voltage supply connection ZVA-j corresponds to the negative line L− of the next cell voltage supply connection ZVA-(j+1). This corresponds to an electrical interconnection of real battery cells and is advantageous for saving electrical lines.

The cell monitoring unit CSC also comprises a current measuring module 3, which is set up to measure for each cell voltage connection ZSA-i a current that flows via at least one of the associated lines L+, L−, and specifically in particular successively for the different cell voltage connections ZSA-i.

If a fault in the cell monitoring unit CSC is identified, the testing device 1 can output a corresponding fault message.

Figure 2:
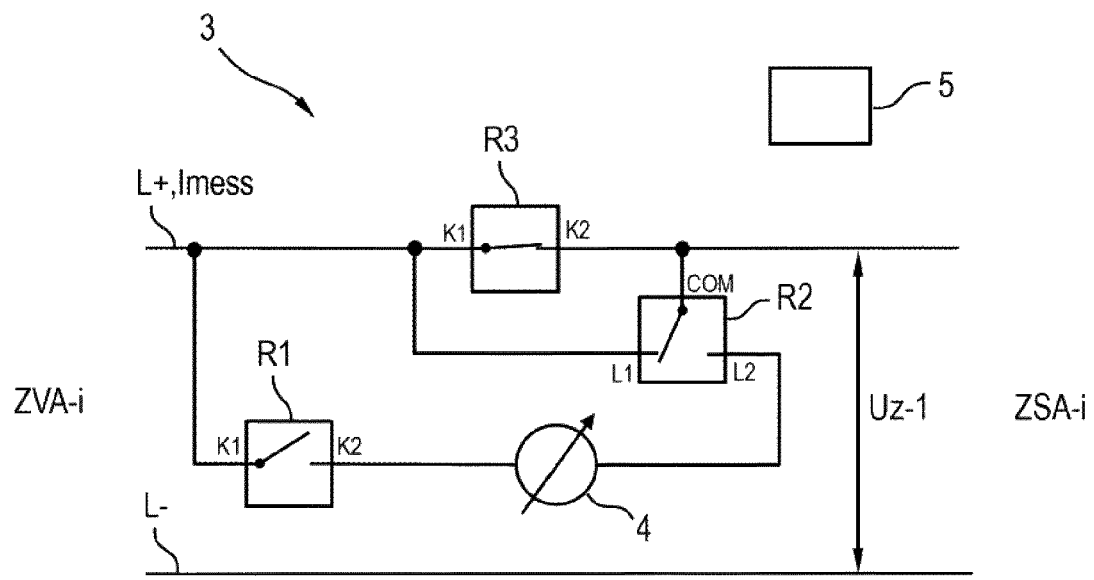
FIG. 2 shows an equivalent circuit diagram of a current measuring circuit for intermediate connection of a current measuring apparatus in a current line leading to a cell voltage connection and having switches in a first switching position.

FIG. 2 shows an equivalent circuit diagram of a circuit of the current measuring module 3 for interconnecting a current measuring apparatus 4 in a positive line L+ leading from a cell voltage apply connection ZVA-i to a cell voltage connection ZSA-i. The circuit comprises a first switch R1, a second switch R2 and a third switch R3, which can be connected by means of a control device 5 (for example a microcontroller).

The first switch R1 is shown here as an on/off switch, the first connection K1 of which is connected to the positive line L+ serving as current line and the second connection K2 of which is connected to a first connection of the current measuring apparatus 4.

The second switch R2 is in the form of a toggle switch, the central connection COM and first contact connection L1 of which are connected to the positive line L+, the first contact connection L1 of which is also connected to the first connection K1 of the first switch R1 and the second contact connection L2 of which is connected to a second connection of the current measuring apparatus 4.

The third switch R3 is shown here as an on/off switch, which is interconnected, in the positive line L+, between the first contact connection L1 and the central connection COM of the second switch R2. Consequently, the first connection K1 thereof is connected to the first connection K1 of the first switch R1 and to the first contact connection L1 of the second switch R2 and the second connection K2 thereof is connected to the central connection COM of the second switch R2. The switches R2 and R3 can also be considered as switches located in parallel branches of the positive line L+.

The control device 5 has switched the switches R1 to R3 in this figure such that they are in a rest state in which the current measuring apparatus 4 is decoupled from the positive line L+ and thus cannot measure a current Imess. More precisely, the control device 5 has switched the switches R1 to R3 such that: the first switch is off, the central connection COM of the second switch R2 is connected to the first contact connection L1 thereof and the third switch R3 is switched on. As a result, if the cell monitoring unit CSC is faulty and a current Imess is produced across the positive line L+, this current Imess is conducted in parallel via the second switch R2 and the third switch R3.

For a current measuring procedure, the control device 5 initially switches the first switch R1 on and switches the second switch R2 over so that the central connection COM is now conductively connected to the second contact connection L2. As a result, the current measuring apparatus 4 is connected in parallel with the third switch R3. With this switchover, the cell voltage Uz-i to the cell voltage connection ZSA-i is not interrupted because the third switch R3 is permanently switched on.

Figure 3:
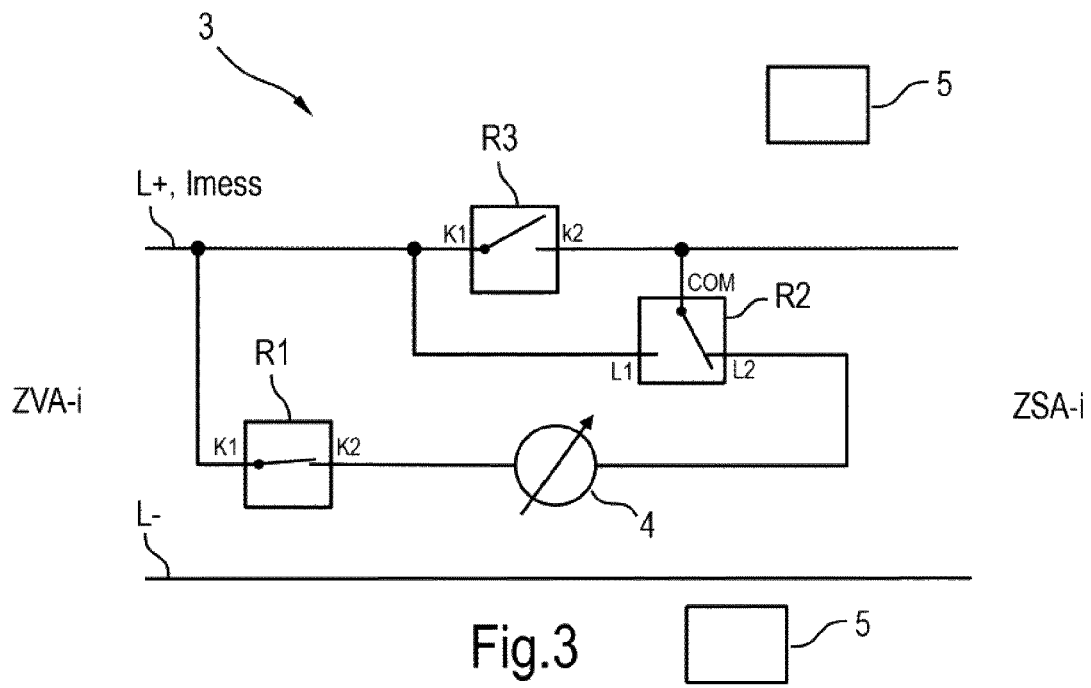
FIG. 3 shows the equivalent circuit diagram from FIG. 2 having the switches in a second switching position.

FIG. 3 shows the equivalent circuit diagram from FIG. 2 in a switching position (also referred to as "current measuring position") that is assumed after the third switch R3 has been switched off in a temporally subsequent step, such that a current Imess through the positive line L+—if one flows at all—now flows only via the current measuring apparatus 4 and thus can be measured reliably thereby.

For the temporally successive or sequential measurement of currents Imess at all of the cell voltage connections ZSA-i, the above steps are carried out in the reverse order for the cell voltage connection ZSA-i after the current measurement until the rest state is reached and then carried out analogously for a further cell voltage connection ZSA-(i+1). If a current Imess>0 or Imess≥Ith is also measured only at one of the cell voltage connections ZSA-i, a fault message is output, specifying the measured cell voltage connection ZSA-i where appropriate.

In order to implement the sequential current measurement, the n relays R1 associated with all of the positive lines L+ can be connected in series with a connection of the current measuring apparatus 4 and the n relays R2 can be connected in series with the other connection of the current measuring apparatus 4.

In general, the cell voltages Uz-i between the lines L+, L− can also be measured and compared, for example, with the cell voltages Uz-i measured by the cell monitoring unit CSC. The cell monitoring unit CSC is thus checked for a further fault source, specifically for an erroneous voltage measurement. In one variant, the cell voltages Uz-i are also measured sequentially, as a result of which a single voltage measuring device (not illustrated) suffices. One development is that a cell voltage Uz-i is measured at a cell voltage connection ZSA-i directly before or after a current measuring process.

Figure 4:
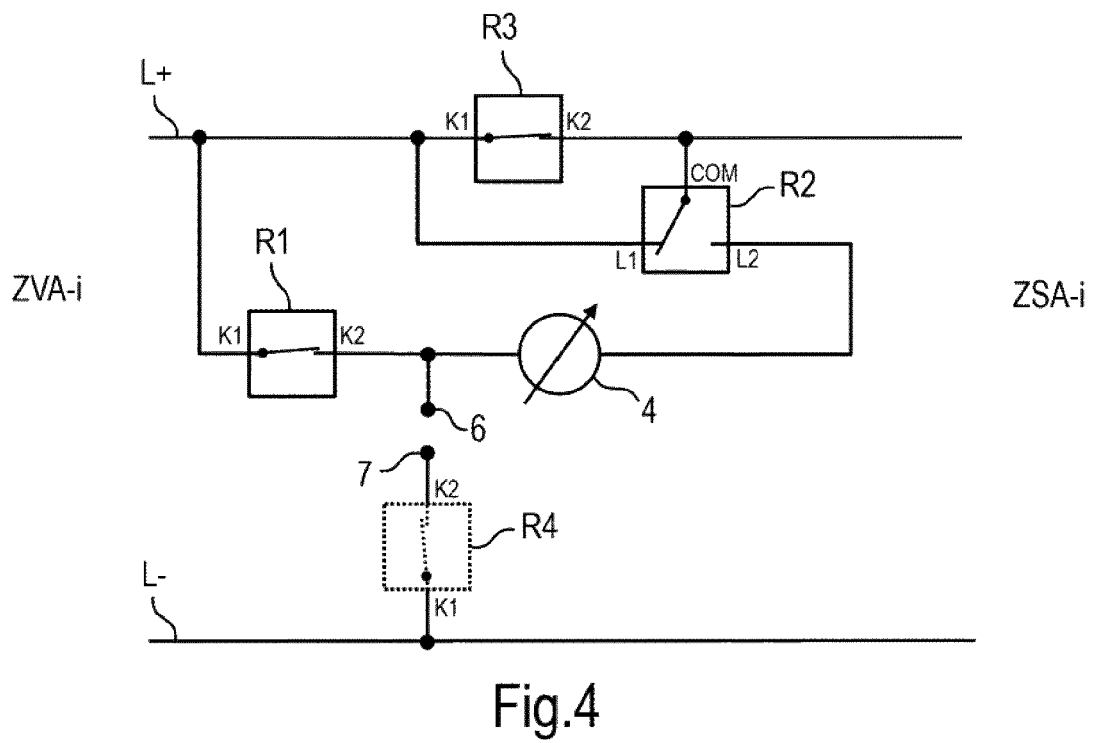
FIG. 4 shows the equivalent circuit diagram from FIG. 2 having the switches in a third switching position suitable for voltage measurement.

FIG. 4 shows the equivalent circuit diagram from FIG. 2 and FIG. 3 in a switching position (also referred to as "voltage measuring position") that is assumed in order to measure the cell voltage Uz-i at the cell voltage connection ZSA-i. For the voltage measurement, the control device 5 switches the first switch R1 on, switches the second switch R2 such that the central connection COM thereof is connected to the first contact connection L1 thereof and switches the third switch R3 on. The cell voltage Uz-i can now be measured for example between the second connection K2 of the first switch R1 and the negative line L−. For example, a voltage tap 6 can be connected to the second connection of the first switch R1 for this purpose.

One development is that a fourth switch R4 is provided for voltage measurement, the fourth switch being connected by way of the first connection K1 thereof to the negative line L− and being connected by way of the second connection K2 thereof to a voltage tap 7. This achieves the advantage that only one voltage measuring device (not illustrated), which can be connected by means of the switches R1 and R4 to the respective cell voltage connection ZSA-i to be measured, is required to measure all of the cell voltages Uz-i. One development is that the current measuring apparatus 4 is used as voltage measuring device.

It is possible for first the current Imess and then the cell voltage Uz-i to be measured at a cell voltage connection ZSA-i, or vice versa.

Figure 5:
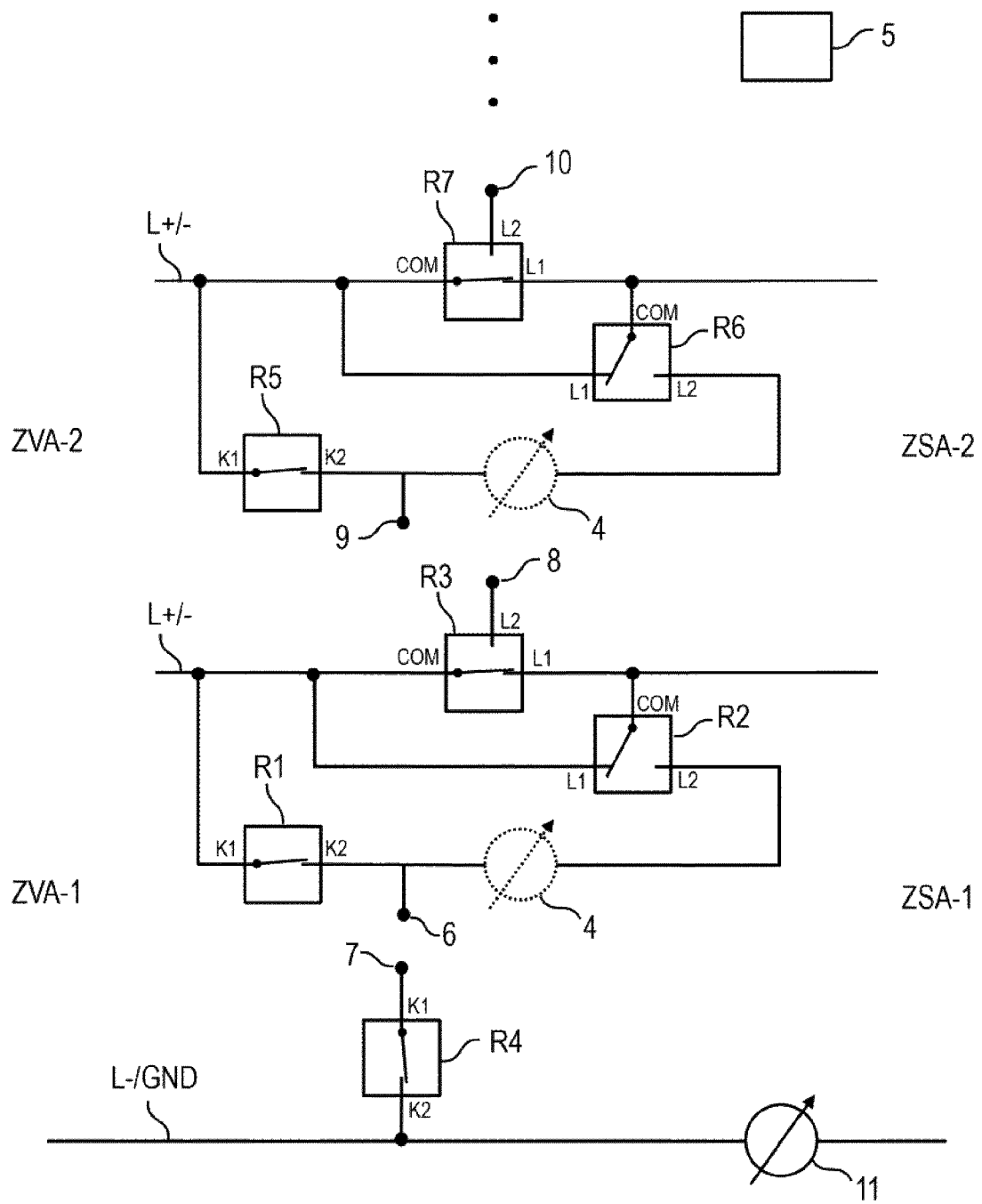
FIG. 5 shows an equivalent circuit diagram of two current measuring circuits of the testing device that are electrically connected in series.

FIG. 5 shows an equivalent circuit diagram of two current measuring circuits for cell voltage connections ZSA-1 and ZSA-2, which are electrically connected in series and which, in a manner analogous to the current measuring circuit shown in FIG. 4, use four switches R1 to R4 or R3, R5 to R7 for current and voltage measurement. The cell voltage supply connections ZSA-1 and ZSA-2 are electrically connected or chained in series in the sense that the positive line L+ of the current measuring circuit for monitoring the first cell voltage connection ZSA-1 corresponds to the negative line L− of the current measuring circuit monitoring the second cell voltage connection ZSA-2. This can be applied analogously to further cell voltage connections ZSA-i with i≥3.

The current measurement circuit R1 to R4 for monitoring the first cell voltage connection ZSA-1 corresponds functionally to the current measuring circuit R1 to R4 from FIG. 4, which is also provided for voltage measurement.

The current measuring circuit R3, R5 to R7 for monitoring the second cell voltage connection ZSA-2 likewise corresponds functionally to the current measuring circuit R1 to R4 from FIG. 4, wherein the switches R5 to R7 take on the function of the switches R1 to R3 and the switch R3 takes on the function of the switch R4 of the current measuring circuit R1 to R4 for monitoring the first cell voltage connection ZSA-1. To this end, the third switch R3 is now designed as a toggle switch, the central connection COM of which is connected to the first connection K1 of the first switch R1 and the first contact connection L1 of which is connected to the central connection COM of the second switch R2. The second contact connection K2 of the third switch R3 is connected to a voltage tap 8.

In particular, the switching positions described in more detail in the text which follows can be used for the temporally successive measurement of the cell voltage Uz-1 and of the current Imess at the first cell voltage connection ZSA-1 and subsequently the cell voltage Uz-2 and the current Imess at the second cell voltage connection ZSA-2. "0" denotes an open on/off switch, "1" denotes a closed on/off switch:

Rest Position

| R1 | R2 | R3 | R4 | R5 | R6 | R7 |
|---|---|---|---|---|---|---|
| 0 | COM-L1 | COM-L1 | 0 | 0 | COM-L1 | COM-L1 |

Voltage Measurement Uz-1 of the First Cell Voltage Connection ZSA-1 at the Voltage Taps 6 and 7

| R1 | R2 | R3 | R4 | R5 | R6 | R7 |
|---|---|---|---|---|---|---|
| 1 | COM-L1 | COM-L1 | 1 | 0 | COM-L1 | COM-L1 |

These switching positions are assumed in particular from the rest position. In particular, there may be a return to the rest position after the voltage measurement.

Current Measurement at the First Cell Voltage Connection ZSA-1

Initially

| R1 | R2 | R3 | R4 | R5 | R6 | R7 |
|---|---|---|---|---|---|---|
| 1 | COM-L2 | COM-L1 | 0 | 0 | COM-L1 | COM-L1 |

Then

| R1 | R2 | R3 | R4 | R5 | R6 | R7 |
|---|---|---|---|---|---|---|
| 1 | COM-L2 | COM-L2 | 0 | 0 | COM-L1 | COM-L1 |

There may be a return to the rest position after the current measurement.

Voltage Measurement Uz-2 of the Second Cell Voltage Connection ZSA-2 at the Voltage Taps 8 and 9

| R1 | R2 | R3 | R4 | R5 | R6 | R7 |
|---|---|---|---|---|---|---|
| 0 | COM-L1 | COM-L2 | 0 | 1 | COM-L1 | COM-L1 |

These switching positions are assumed in particular from the rest position. In particular, there may be a return to the rest position after the voltage measurement.

Current Measurement at the Second Cell Voltage Connection ZSA-2

Initially

| R1 | R2 | R3 | R4 | R5 | R6 | R7 |
|---|---|---|---|---|---|---|
| 0 | COM-L1 | COM-L1 | 0 | 1 | COM-L2 | COM-L1 |

Then

| R1 | R2 | R3 | R4 | R5 | R6 | R7 |
|---|---|---|---|---|---|---|
| 0 | COM-L1 | COM-L2 | 0 | 1 | COM-L2 | COM-L2 |

There may be a return to the rest position after the current measurement.

This process can be carried out analogously for further cell voltage connections ZSA-i with i≥3, wherein the toggle switch R7 is used analogously to the switch R3 both for current conduction of the second cell voltage connection ZSA-2 and for the voltage measurement Uz-3 of the third cell voltage connection ZSA-3 etc.

One advantage consists in a particularly low number of switches being required owing to the double function of the third switch R3, the seventh switch R7, etc., which makes a particularly inexpensive design possible.

Only one single current measuring apparatus 5 is required for the current measurements of the individual cell voltage connections ZSA-i, the single current measuring apparatus being interconnected to the corresponding current path by way of the switches R1 and R2, R5 and R6, etc.

Only one single current measuring apparatus is required for the current measurements of the individual cell voltage connections ZSA-i, the single current measuring apparatus being able to be connected to the corresponding negative lines L− by way of the switches R4, R3, etc.

Since the negative line L− of the first cell voltage connection ZSA-1 is at the lowest reference potential (also referred to as ground GND), a further current measuring apparatus 11 may advantageously be present in the line, the further current measuring apparatus measuring a current fed back by the cell monitoring unit CSC.

The present invention is of course not restricted to the exemplary embodiment shown.

The switches R1, R5, etc., can thus also be designed as toggle switches with a free or non-occupied contact connection.

In general, "a(n)", "one", etc. can be understood as a singular or a plural, particularly in the sense of "at least one" or "one or more", etc., as long as this is not explicitly excluded, for example by the expression "exactly one", etc.

A numerical value can also comprise precisely the specified number and a customary tolerance range, as long as this is not explicitly ruled out.

LIST OF REFERENCE SIGNS

1 Testing device
2 Voltage source unit
3 Current measuring module
4 Current measuring apparatus
5 Control device
COM Central connection
CSC Cell monitoring unit
K1 First connection of an on/off switch
K2 Second connection of an on/off switch
L1 First contact connection
L2 Second contact connection
L+ Positive electrical line
L− Negative electrical line
R1 First switch
R2 Second switch
R3 Third switch
Uz-i Cell voltage of the i-th cell voltage connection
ZSA-1 First cell voltage connection
ZSA-i i-th cell voltage connection
ZSA-n n-th cell voltage connection
ZVA-1 First cell voltage supply connection
ZVA-j j-th cell voltage supply connection
ZVA-m m-th cell voltage supply connection

What is claimed is:

1. A method for testing a cell monitoring unit, comprising:
applying respective cell voltages to cell voltage connections of the cell monitoring unit; and
carrying out a measurement on a cell monitoring unit which is in operation in order to determine whether a respective current is flowing via at least one cell voltage connection, and, when this is the case, outputting a fault message,
wherein measuring the current comprises interconnecting a current measuring apparatus without interruption in a current line leading to a respective cell voltage connection, further comprising:
connecting the current measuring apparatus initially in parallel with the current line; and then
opening a branch of the current line in parallel with the connections of the current measuring apparatus.

2. The method according to claim 1, wherein the current is measured successively at the cell voltage connections.

3. The method according to claim 1, wherein a measurement is carried out in order to determine whether a respective current flows at all via at least one cell voltage connection.

4. The method according to claim 1, wherein a measurement is carried out in order to determine whether a respective current that is equal to or greater than a predetermined threshold value flows via at least one cell voltage connection.

5. The method according to claim 1, wherein the cell voltages applied to the cell voltage connections are additionally measured.

6. A testing device for testing a cell monitoring unit, comprising:
at least one current measuring apparatus for measuring currents at cell voltage connections of the cell monitoring unit;
at least one control device; and
a plurality of switches, wherein
the at least one control device is configured to:
control the plurality of switches to apply respective cell voltages to cell voltage connections of the cell monitoring unit;
control the plurality of switches to interconnect the current measuring apparatus without interruption in a current line leading to a respective cell voltage connection in order to measure the current by:
controlling the plurality of switches to initially connect the current measuring apparatus in parallel with the current line; and then
controlling the plurality of switches to open a branch of the current line in parallel with the connections of the current measuring apparatus; and
carry out a measurement on the cell monitoring unit which is in operation in order to determine whether a respective current is flowing via at least one cell voltage connection, and, when this is the case, output a fault message.

7. The testing device according to claim 6 for testing the cell monitoring unit, wherein
the plurality of switches comprise, for each cell voltage connection to be monitored:
a first switch, a first connection of which is connected to the current line and a second connection of which is connected to a first connection of the current measuring apparatus,
a second switch in the form of a toggle switch, a central connection and first contact connection of which are connected to the current line, the first contact connection of which is connected to the first connection of the first switch and a second contact connection of which is connected to a second connection of the current measuring apparatus, and a third switch, which is interconnected, in the current line, between the central connection and the first contact connection of the second switch, wherein the at least one control device is configured to:
switch the switches in a rest state outside of a current measuring procedure in such a way that:
the first switch is switched off,
the central connection of the second switch is connected to the first contact connection of the second switch, and
the third switch between the central connection and the first contact connection of the second switch is switched on, and
wherein the at least one control device for a current measuring procedure is configured to:
initially switch on the first switch and to connect the central connection of the second switch to the second contact connection of the second switch to initially connect the current measuring apparatus in parallel with the current line, and then
switch off the third switch between the central connection and the first contact connection of the second switch to open the branch of the current line in parallel with the connections of the current measuring apparatus.

8. The testing device according to claim 7, wherein the third switch is a toggle switch, which:
is connected by way of the central connection thereof to the first connection of the first switch,
is connected by way of the first contact connection thereof to the central connection of the second switch, and
is connected by way of the second contact connection thereof to a voltage tap.

* * * * *